US012750054B2

(12) United States Patent
Singrigowda et al.

(10) Patent No.: US 12,750,054 B2
(45) Date of Patent: Sep. 29, 2026

(54) SYSTEMS AND METHODS FOR ADAPTIVE GATE VOLTAGE GENERATION OF PAD-CONNECTED DEVICES

(71) Applicant: Advanced Micro Devices, Inc., Santa Clara, CA (US)

(72) Inventors: Jagadeesh Anathahalli Singrigowda, Bangalore (IN); Rajesh Mangalore Anand, Bangalore (IN); Shreevatsa M, Bangalore (IN); Girish A S, Bangalore (IN); Prasant Kumar Vallur, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 66 days.

(21) Appl. No.: 18/752,573

(22) Filed: Jun. 24, 2024

(65) Prior Publication Data

US 2025/0392308 A1 Dec. 25, 2025

(51) Int. Cl.
*H03K 17/687* (2006.01)

(52) U.S. Cl.
CPC ..... *H03K 17/6874* (2013.01); *H03K 17/6872* (2013.01)

(58) Field of Classification Search
CPC ........... H03K 17/6874; H03K 17/6872; H03K 19/00315; H03K 19/018521; H03K 19/0175; H03K 19/017509; H03K 17/10; H03K 17/102; H03K 19/003; H03K 19/00361; G06F 3/00; G06F 3/002
See application file for complete search history.

(56) References Cited

U.S. PATENT DOCUMENTS

2021/0409020 A1* 12/2021 Singrigowda .... H03K 17/08122

* cited by examiner

*Primary Examiner* — Jung Kim
(74) *Attorney, Agent, or Firm* — Greenberg Traurig, LLP

(57) ABSTRACT

A circuit includes a first and second PMOS transistor serially coupled between a high voltage power supply and a pad, a gate of the first PMOS transistor coupled to a first signal from an internal circuit, the first signal configured to switch between a first voltage and the high voltage power supply, a gate and drain of the second PMOS transistor connected to an adaptive control node and the pad, respectively, and a first and second NMOS transistor serially coupled between the pad and a ground, a gate of the first NMOS transistor coupled to a second signal from the internal circuit, the second signal configured to switch between a second voltage and the ground, a gate and drain of the second NMOS transistor connected to the adaptive control node and the pad, respectively, wherein the adaptive control node is configured to switch between the first and second voltage.

20 Claims, 7 Drawing Sheets

SYSTEMS AND METHODS FOR ADAPTIVE GATE VOLTAGE GENERATION OF PAD-CONNECTED DEVICES

BACKGROUND

In a semiconductor device, an output driver conveys an internal signal to the outside circuitries and is an interface between the internal and external circuitries of the semiconductor device. The semiconductor device can be made with an advanced technology, such as 5 nm technology node, with thinner gate oxides and shallow junctions, therefore, its internal circuitries can be limited to work with a low voltage, such as 1.5 V. However, the semiconductor device can be used in a legacy board or standard applications of 3.3 V, therefore, the output driver circuit is exposed to 3.3 V.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Figure 1:
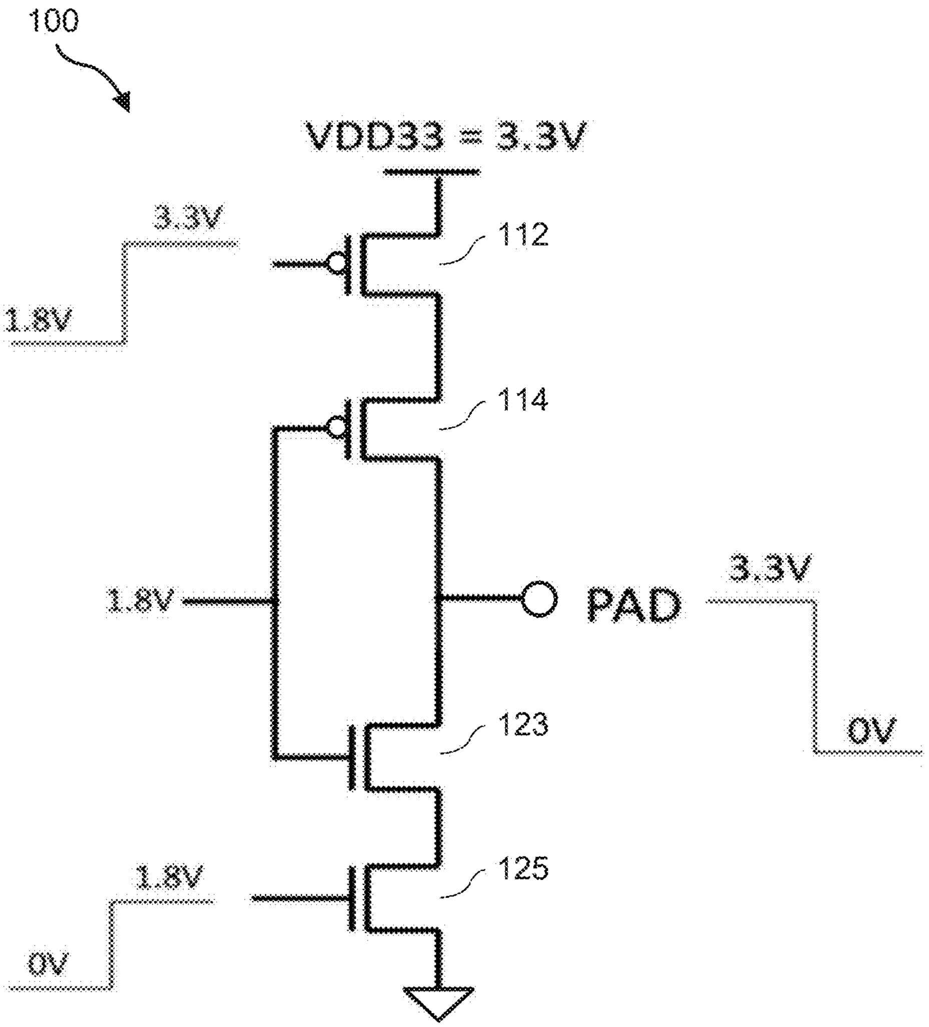
FIG. 1 is a schematic diagram of an exemplary 2-stack output driver circuit.

Throughout the drawings, identical reference characters and descriptions indicate similar, but not necessarily identical, elements. While the examples described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to a method and device for generating adaptive gate voltage for an output driver circuit. With the adaptive gate voltage, the output drive circuit stress-freely works with high external voltage and low internal voltage.

The following will provide, with reference to FIGS. 1-7, detailed descriptions of example systems and methods for adaptive gate voltage generation.

The present disclosure describes an apparatus that includes a first and second PMOS transistor serially coupled between a first high voltage power supply and a pad, a gate and drain of the second PMOS transistor connected to an adaptive control node and the pad, respectively, and a first and second NMOS transistor serially coupled between the pad and a ground, a gate and drain of the second NMOS transistor connected to the adaptive control node and the pad, respectively, wherein the adaptive control node is configured to switch between a first and second voltage, the first voltage being lower than the first high voltage power supply, and the second voltage being lower than the first voltage but higher than the ground.

In implementations, a gate of the first PMOS transistor is coupled to a first signal from an internal circuit, the first signal configured to switch between the first voltage and the first high voltage power supply, and a gate of the first NMOS transistor is coupled to a second signal from the internal circuit, the second signal configured to switch between the second voltage and the ground.

In implementations, the apparatus of the present disclosure further includes a third PMOS transistor serially coupled between the first and second PMOS transistor, and a third NMOS transistor serially coupled between the first and second NMOS transistor, wherein a gate of the third PMOS transistor is applied the first voltage and a gate of the third NMOS transistor is applied the second voltage.

In implementations, the first, second and third PMOS and the first, second and third NMOS are manufactured in a same process as the internal circuit.

In an implementation, when the gate of the first PMOS transistor is at the first voltage and the gate of the first NMOS transistor is at the ground, the adaptive control node is at the first voltage.

In another implementation, when the gate of the first PMOS transistor is at the first high voltage power supply and the gate of the first NMOS transistor is at the second voltage, the adaptive control node is at the second voltage.

In another implementation, the adaptive control node is selectively coupled to a transmit logic circuit or a receive logic circuit in response to a state of an output enable signal.

For selecting either the transmit logic circuit or the receive logic circuit, the transmit logic circuit receives a data signal switching between a logic high state and a logic low state, wherein when the output enable signal enables the transmit logic circuit and the data signal is at the logic high state, the transmit logic circuit drives the adaptive control node to the first voltage and the pad is at the first high voltage power supply, and wherein when the output enable signal enables the transmit logic circuit and the data signal is at the logic low state, the transmit logic circuit drives the adaptive control node to the second voltage and the pad is at the ground.

In addition, when the data signal is at the logic high state, the first signal is at the first voltage and the second signal is at the ground; and when the data signal is at the logic low state, the first signal is at the first high voltage power supply and the second signal is at the second voltage.

The receive logic circuit is coupled to the pad, wherein when the output enable signal enables the receive logic circuit and the pad is at the first high voltage power supply, the receive logic circuit drives the adaptive control node to the first voltage, and wherein when the output enable signal enables the receive logic circuit and the pad is at the ground, the receive logic circuit drives the adaptive control node to the second voltage.

In an implementation, when the output enable signal enables the receive logic circuit and the pad is at a second high voltage power supply lower than the first high voltage power supply, the receive logic circuit drives the adaptive control node to the second voltage.

In another implementation, the receive logic circuit receives a voltage select signal configured to switch between the logic high state and the logic low state depending on the pad being at the first high voltage power supply or the second high voltage power supply.

The present disclosure allows an output driver circuit manufactured with an advanced technology node to still work with legacy high voltage external systems.

FIG. 1 is a schematic diagram of an exemplary 2-stack output driver circuit 100. The output driver circuit 100 includes 2 PMOS transistors 112 and 114 and 2 NMOS transistors 123 and 125. PMOS transistors 112 and 114 are serially connected between a high voltage power supply VDD33 (3.3 V) and an output terminal PAD. NMOS transistors 123 and 125 are serially connected between a ground and PAD. In the above serial connections, one transistor's drain is connected to an adjacent transistor's source.

Referring again to FIG. 1, a gate of PMOS transistor 114 and a gate of NMOS transistor 123 are connected together to a high voltage supply 1.8 V. A gate of PMOS transistor 112 is connected to a data path signal (e.g., from an internal circuit such as a logic unit and/or other data circuit) switching between 1.8 V and 3.3 V. A gate of NMOS transistor 125 is connected to another data path signal (e.g., from the internal circuit) switching between 0 V and 1.8 V. The data path signals determine whether PAD is pulled up to VDD33 or down to the ground, for example corresponding to logic high or low signals based on a desired output. Therefore, PMOS transistor 112 and NMOS transistor 125 sustain only 1.8 V; and as gates of PMOS transistor 114 and NMOS transistor 123 are constantly biased to 1.8 V, PMOS transistor 114 and NMOS transistor 123 also experience only 1.8 V. In output driver circuit 100, potential difference between any two terminals of each of transistors 112, 114, 123 and 125 does not exceed nominal 1.8 V.

Although FIG. 1 uses real voltage values to illustrate the principle of lowering the voltage across a transistor's terminals, these voltages can be of different values. In addition, the gate of PMOS transistor 114 and the gate of NMOS transistor 123 can be driven by an adaptive control node.

Figure 2:
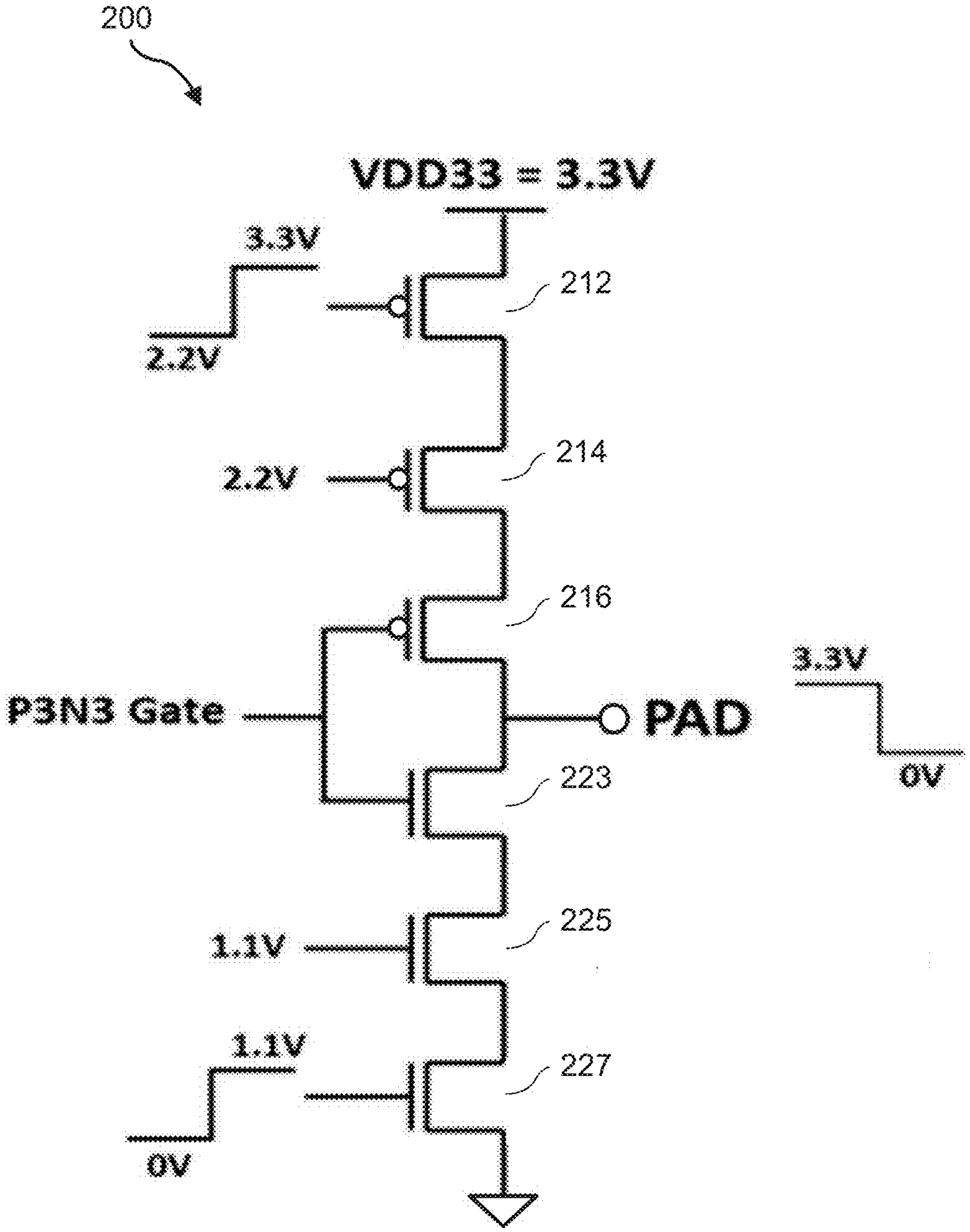
FIG. 2 is a schematic diagram of an exemplary 3-stack output driver circuit.

FIG. 2 is a schematic diagram of an exemplary 3-stack output driver circuit 200. The 3-stack output driver circuit 200 includes 3 PMOS transistors 212, 214 and 216 and 3 NMOS transistors 223, 225 and 227. PMOS transistors 212, 214 and 216 are serially connected between VDD33 and PAD. NMOS transistors 223, 225 and 227 are serially connected between PAD and the ground. A gate of the top PMOS transistor 212 is applied a data path signal (e.g., from an internal circuit) switching between 2.2 V and 3.3 V. A gate of the bottom NMOS transistor 227 is applied another data path signal (e.g., from the internal circuit) switching between 0 V and 1.1 V. The data path signals determine whether PAD is pulled up to VDD33 or down to the ground, for example corresponding to logic high or low signals based on a desired output. An intermediate voltage such as 2.2 V is applied to a gate of the middle PMOS transistor 214. Another intermediate voltage such as 1.1 V is applied to a gate of the middle NMOS transistor 225. Accordingly, PMOS transistor 214 and NMOS transistor 225 are constantly biased to 2.2 V and 1.1 V, respectively, to protect the transistors 212-227 from voltage stress (e.g., having terminals of a transistor sustain a voltage difference exceeding a safe operating voltage). In implementations, the intermediate voltages 2.2 V and 1.1 V are derived from the 3.3 V power supply voltage.

Referring again to FIG. 2, a gate of the bottom PMOS transistor 216 and a gate of the top NMOS transistor 223 are connected together to a node P3N3 gate. A drain of PMOS transistor 216 and a drain of NMOS 223 are connected together to PAD. As PAD switches between 3.3 V and 0 V and can further operate in transmit (TX) or receive (RX) modes (e.g., transmitting an output to an external device coupled to PAD or receiving an input signal from the external device), P3N3 gate can be adaptively biased in the TX or RX modes to avoid any electrical stress to the transistors 212-227 and to maintain correct functionality.

Figure 3:
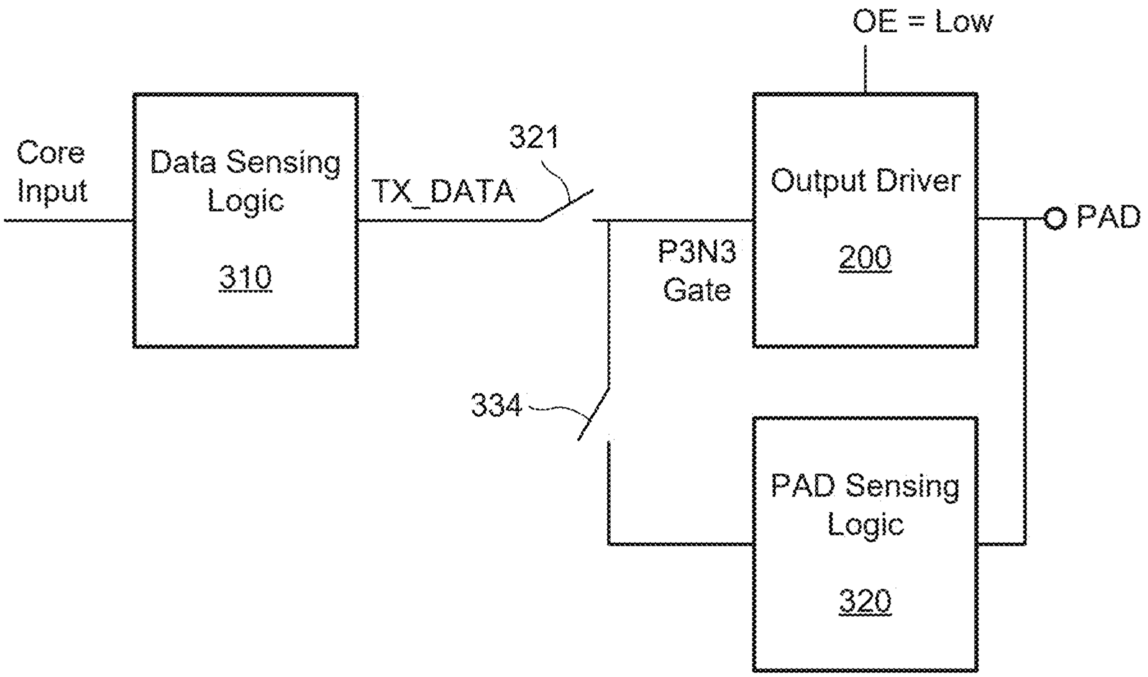
FIG. 3 is a block diagram illustrating exemplary driving signals of the output driver circuit during transmit and receive mode.

FIG. 3 is a block diagram illustrating exemplary driving signals of the output driver circuit 200 during transmit and receive mode. During the transmit mode, an illustrative switch 321 is closed while an illustrative switch 334 is open, so that only a data sensing logic 310 is connected to output driver 200. During the transmit mode, an output enable (OE) signal turns to logic high state, and a data sensing logic 310 senses internal input data (iA) and provides output data, TX_DATA, to P3N3 Gate of the output driver circuit 200. The input data (iA) is provided by an internal circuit of an integrated circuit that employs the output driver circuit 200. The input data (iA) from the internal circuit is to be reflected at the PAD. Therefore, the output driver circuit 200 is data dependent during the transmit mode.

During the receive mode, illustrative switch 321 is open while illustrative switch 334 is closed, so that only a PAD sensing logic 320 is connected to output driver 200. During the receive mode, PAD sensing logic 320 senses PAD voltage to adaptively bias the output driver circuit 200 at P3N3 gate. Therefore, the output driver circuit 200 is PAD voltage dependent during the receive mode.

Figure 4:
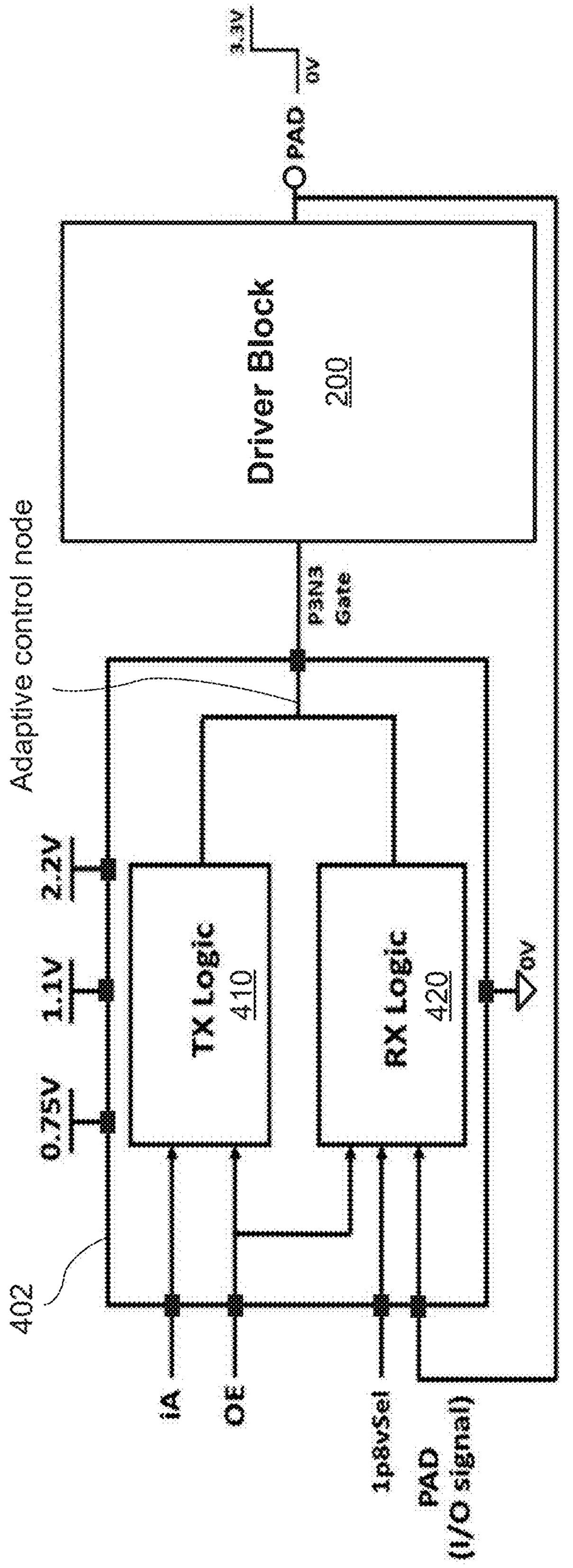
FIG. 4 is a block diagram illustrating an exemplary gate voltage generation circuit for the output driver circuit.

FIG. 4 is a block diagram illustrating an exemplary gate voltage generation circuit 402 for the output driver circuit 200. The gate voltage generation circuit 402 includes a transmit logic circuit 410 and a receive logic circuit 420. Input data (iA) from the internal circuit is provided to transmit logic circuit 410. Output enable signal (OE) is provided to both transmit logic circuit 410 and receive logic circuit 420. A 1.8 V mode switch signal (1*p*8*v*Sel) is provided to receive logic circuit 420. The 1*p*8*v*Sel detects whether PAD is 3.3 V or 1.8 V in the receive mode. In some examples, an external device attached to PAD can operate in a different voltage domain (e.g., 1.8 V) than that of gate voltage generation circuit 402 (e.g., 3.3 V). Accordingly, the 1*p*8*v*Sel signal signals a switching between the 3.3 V domain and the 1.8 V domain. PAD is also provided to receive logic circuit 420. The gate voltage generation circuit 402 provides an adaptive control node which is connected to the P3N3 gate of the output driver circuit 200. The adaptive control node is connected to both an output of transmit logic circuit 410 and an output of receive logic circuit 420.

Referring again to FIG. 4, in an implementation, gate voltage generation circuit 402 is supplied with three voltages: 0.75 V as an internal supply voltage, and intermediate voltages 1.1 V and 2.2 V generated from either a low-power low dropout (LDO) regulator or resistor dividers from a 3.3 V power supply voltage (not shown). A ground for gate voltage generation circuit 402 is 0 V.

During the transmit mode, iA and OE signals are sensed in the transmit logic circuit 410 which generates the required bias voltage level at the P3N3 gate. During the transmit mode, receive logic circuit 420 is disabled, so that only transmit logic circuit 410 drives the P3N3 gate.

During the receive mode, PAD and OE signals are sensed in receive logic circuit 420 which generates the required bias voltage level at the P3N3 gate. During the receive mode, transmit logic circuit 410 is disabled, so that only receive logic circuit drives the P3N3 gate.

Figure 5:
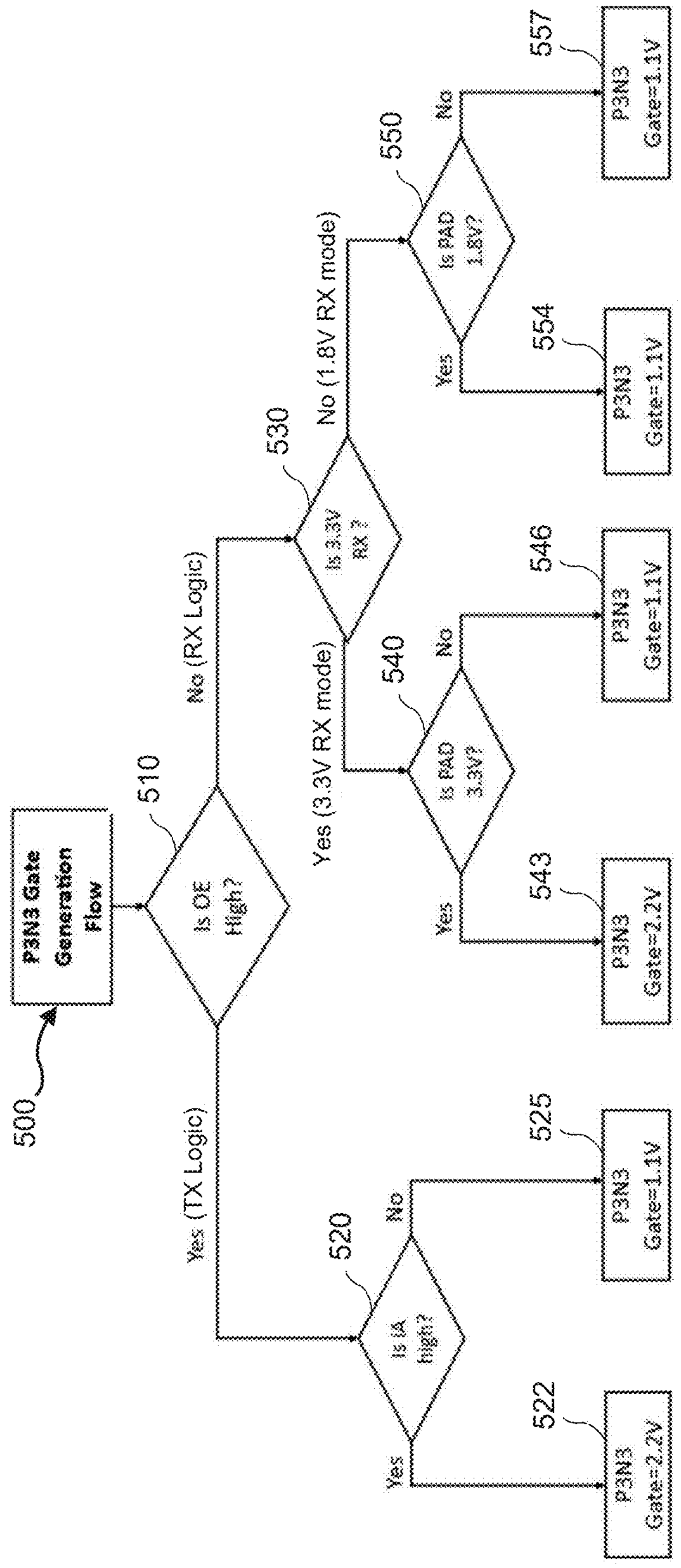
FIG. 5 is a flowchart illustrating an implementation of an adaptive gate voltage generation process.

FIG. 5 is a flowchart illustrating an implementation of an adaptive gate voltage generation process 500. Process 500 first determines whether to enter transmit mode or receive mode based on the state of the output enable signal (OE) in block 510. If OE is in logic high state, process 500 enters transmit mode by activating transmit logic circuit 410 shown in FIG. 4. Then a state of the input data (iA) from the internal circuit determines P3N3 gate voltage in block 520. If iA is in logic high state, P3N3 gate voltage turns to 2.2 V (block 522).

Referring again to FIG. 2, when P3N3 gate is at 2.2 V, PMOS transistor 216 is "off", and NMOS transistor 223 is "on". As the logic high state of iA applies 3.3 V on the gate of PMOS transistor 212 to turn it "off" and 1.1 V on a gate of NMOS transistor 227 to turn it "on", PAD is pulled down to the ground. As a result, none of transistors 212-227 sustains more than nominal 1.1 V across its two terminals in this state.

Referring again to FIG. 5, when iA is logic low state in block 520, P3N3 gate voltage turns to 1.1 V (block 525).

Referring again to FIG. 2, when P3N3 gate is at 1.1 V, PMOS transistor 216 is "on". As the logic low state of iA applies 0 V at the gate of NMOS transistor 227 to turn it "off", PAD is pulled up to VDD33. As a result, again none of transistors 212-227 sustains more than nominal 1.1 V across its two terminals in this state.

Referring again to FIG. 5, when OE is at logic low state in block 510, process 500 turns to receive mode, and proceeds to block 530 where 1*p*8*v*Sel signal is detected. If 1*p*8*v*Sel signal of FIG. 4 indicates a 3.3 V external operation, process 500 proceeds to block 540 where receive logic circuit 420 of FIG. 4 detects PAD voltage. If PAD is at 3.3 V, P3N3 gate turns to 2.2 V (block 543).

Referring again to FIG. 2, when P3N3 gate is at 2.2 V and PAD is at 3.3 V, no transistors 212-227 sustain more than nominal 1.1 V across its two terminals.

Referring again to FIG. 5, when no voltage is applied at PAD in block 540, P3N3 gate turns to 1.1 V (block 546). In this case, again no transistors 212-227 shown in FIG. 2 sustain more than nominal 1.1 V across its two terminals.

Referring again to FIG. 5, when 1*p*8*v*Sel signal of FIG. 4 indicates a 1.8 V external operation, process 500 proceeds to block 550 where receive logic circuit 420 of FIG. 4 detects PAD voltage. If PAD is at 1.8 V, P3N3 gate turns to 1.1 V (block 554).

Referring again to FIG. 2, when P3N3 gate is at 1.1 V and PAD is at 1.8 V, no transistors 212-227 sustain more than nominal 1.1 V across its two terminals.

Referring again to FIG. 5, when no voltage is applied at PAD in block 550, P3N3 gate turns to 1.1 V (block 557). In this case, again no transistors 212-227 shown in FIG. 2 sustain more than nominal 1.1 V across its two terminals.

Although real voltage values are used throughout FIGS. 1-5 and associated descriptions, the principle of applying adaptively gate voltages to avoid electrical stress across transistor terminals as above described also applies to other voltage values.

Below TABLE 1 shows the required value of all the devices in output driver circuit 200 of FIG. 2 during all possible valid input combinations to avoid electrical stress on the devices. In an implementation, the output driver circuit 200 is made for nominal 1.5 V operation and the external operation voltage at PAD is at nominal 3.3 V.

TABLE 1

| OE | 1p8vSel | iA | PMOS 212 Gate | NMOS 227 Gate | PMOS 214 Gate | NMOS 225 Gate | P3N3 gate | PAD |
|---|---|---|---|---|---|---|---|---|
| 0.75 V | 0 V | 0.75 V | 2.2 V | 0 V | 2.2 V | 1.1 V | 2.2 V | 3.3 V |
| | (3.3 V domain) | 0 V | 3.3 V | 1.1 V | 2.2 V | 1.1 V | 1.1 V | 0 V |
| 0 V | 0 V | Don't care | 3.3 V | 0 V | 2.2 V | 1.1 V | 2.2 V | 3.3 V |
| | (3.3 V domain) | Don't care | 3.3 V | 0 V | 2.2 V | 1.1 V | 1.1 | 0 V |
| | 0.75 V | Don't care | 3.3 V | 0 V | 2.2 V | 1.1 V | 1.1 V | 1.8 V |
| | (1.8 V domain) | Don't care | 3.3 V | 0 V | 2.2 V | 1.1 V | 1.1 V | 0 V |

Figure 6:
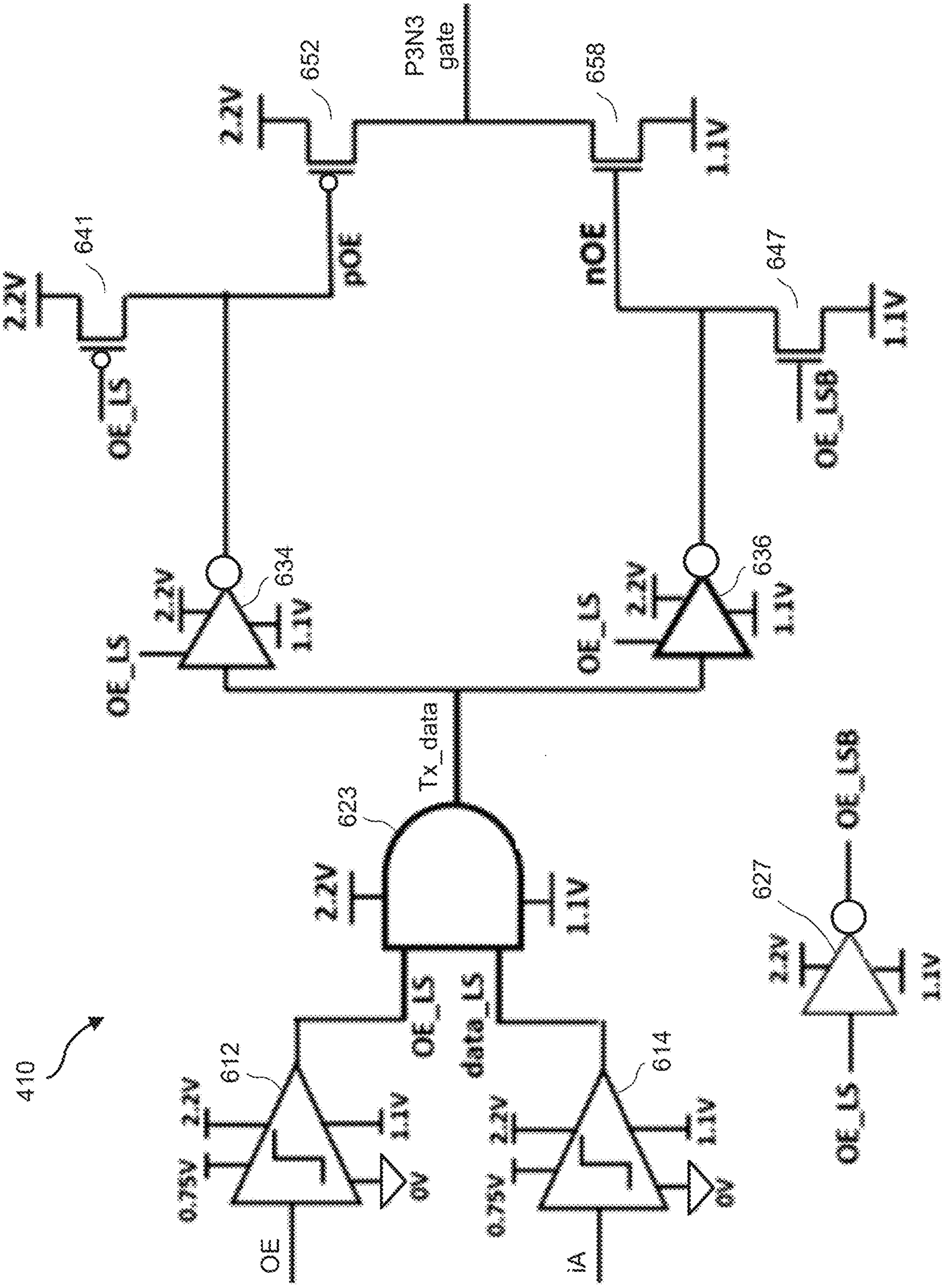
FIG. 6 is a schematic diagram of an exemplary implementation of transmit logic circuit.

FIG. 6 is a schematic diagram of an exemplary implementation of transmit logic circuit 410. In this implementation, transmit logic circuit 410 takes OE and iA as input signals and P3N3 gate as an output signal which is provided to the gates of PMOS transistor 216 and NMOS transistor 223 shown in FIG. 2. When OE is at logic low state, OE_LS at a gate of PMOS transistor 641 turns on PMOS transistor 641 and pulls up node pOE to logic high state (such as 2.2 V) which turns off PMOS transistor 652. At the same time, OE_LSB at a gate of NMOS transistor 647 is at logic high state, which turns on NMOS transistor 647 and pulls down node nOE to logic low state (such as 1.1 V). Logic low state of node nOE turns off NMOS transistor 658. As a result of both PMOS transistor 652 and NMOS transistor 658 being turned off in response to OE being in logic low state, P3N3 gate is in a tristate, i.e., transmit logic circuit 410 is turned off to avoid multi-driving situation when receive logic circuit 420 is driving P3N3 gate.

Referring again to FIG. 6, when OE is at the logic high state, the state of iA determines a node TX_data, and PMOS transistor 641 and NMOS transistor 647 are both turned off. When iA is at the logic high state, TX_data is also at the logic high state which turns on PMOS transistor 652 and turns off NMOS transistor 658 through invertors 634 and 636, respectively. As a result of iA being at the logic high state, PMOS transistor 652 pulls up P3N3 gate to 2.2 V. When iA is at the logic low state, TX_data is also at the logic low state which turns off PMOS transistor 652 and turns on NMOS transistor 658 through invertors 634 and 636, respectively. As a result of iA being at the logic low state, NMOS 658 pulls down P3N3 gate to 1.1 V.

Referring again to FIG. 6, iA and OE signals are level shifted from (0 V→0.75 V) domain to (1.1 V→2.2 V) domain through level-shifters 612 and 614.

Figure 7:
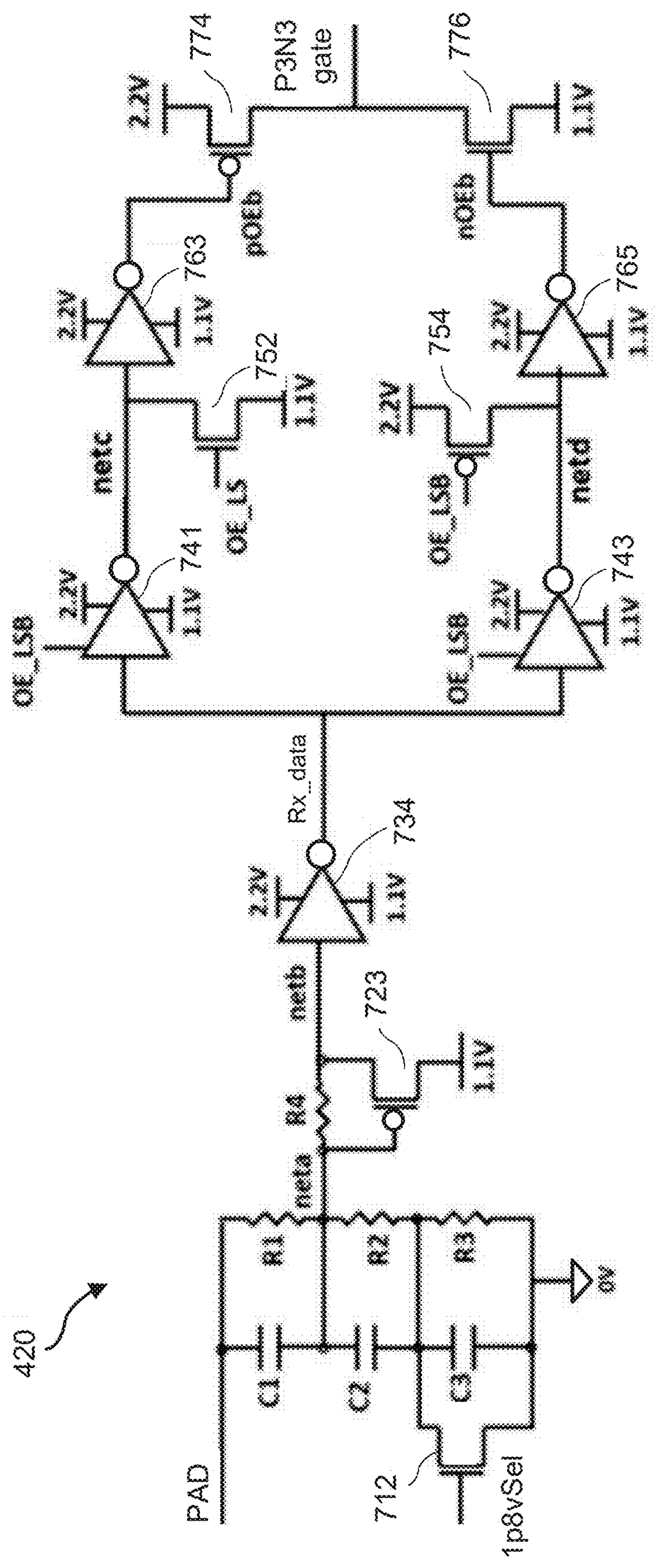
FIG. 7 is a schematic diagram of an exemplary implementation of receive logic circuit.

FIG. 7 is a schematic diagram of an exemplary implementation of receive logic circuit 420. In this implementation, receive logic circuit 420 takes PAD, 1*p*8*v*Sel, OE_LS and OE_LSB as input signal and outputs to P3N3 gate of output driver circuit 200 shown in FIG. 2.

As shown in FIG. 7, when OE is at the logic high state to enable output, OE_LSB is at the logic low state (such as 1.1 V) which turns invertors 741 and 743 to tristate. At the same time, the logic low state of OE_LSB turns on PMOS transistor 754 to pull up node netd to 2.2 V and nOEb to 1.1 V which turns off NMOS transistor 776. In another path, the logic high state at OE_LS turns on NMOS transistor 752 to pull down node netc to 1.1 V and pOEb to 2.2 V which turns off PMOS transistor 774. Therefore, as a result of OE being at logic high state, receive logic circuit 420 is turned off to avoid multi-driving situation when transmit logic circuit 410 is driving P3N3 gate.

Referring again to FIG. 7, when OE is the logic low state to disable output, receive logic circuit 420 is enabled to provide adaptive voltage at P3N3 gate. In this state, both NMOS transistor 752 and PMOS transistor 754 are turned off to allow PAD and 1*p*8*v*Sel to drive voltage level at P3N3 gate.

For example, when PAD is at 3.3 V of the 3.3 V domain, an RC ladder formed by R1, R2 and R3 lowers down node neta to a voltage level permissible for receive logic circuit 420 to function without any electrical stress. At this time, node neta is at the logic high state (such as 2.2 V) which results in node Rx_data being at the logic low state, node netC being at the logic high state and node pOEb at the logic low state which turns on PMOS transistor 774 to pull up P3N3 gate to 2.2 V. At the same time, node Rx_data's logic low state results in node netd being at the logic high state and node nOEb being at logic low state which turns off NMOS transistor 776 to not fight PMOS transistor 774.

When PAD is at 0 V of either the 3.3 domain or 1.8 domain, node neta is at 0 V which results in node Rx_data being at logic high state, node netd being at logic low state and node nOEb being at logic high state which turns on NMOS transistor 776 to pull down P3N3 gate to 1.1 V. At the same time, node Rx_data's logic high state results in node netc being at logic low state and node pOEb being at logic high state which turn off PMOS transistor 774 to not fight NMOS transistor 776.

When PAD is 1.8 V of the 1.8 domain, signal 1*p*8*v*Sel is at 0.75 V to turn on NMOS transistor 712 to short circuit resistor R3, so that node neta is at the logic low state (such as 0.6 V) which results in node Rx_data being at logic high state, node netd being at logic low state and node nOEb being at logic high state which turns on NMOS transistor 776 to pull down P3N3 gate to 1.1 V. At the same time, node Rx_data's logic high state results in node netc being at logic low state and node pOEb being at logic high state which turn off PMOS transistor 774 to not fight NMOS transistor 776.

As shown in FIGS. 2-7, the present disclosure provides an output driver circuit with adaptive gate voltages and associated logic circuits. As output driver circuit is an interface between low internal voltage and high external voltage, with the adaptive gate voltages, the output driver circuit can avoid electric stress to its devices.

Specifically, the present disclosure adaptively biases the P3N3 gate effectively whenever there is a switch over between 3.3 V transmit mode, 3.3 V receive mode or 1.8 V receive mode seamlessly to ensure the circuit always works in safe operating area (SOA) across voltage variations, thus, increasing the lifetime and reliability of the devices.

As constant 1.1 V is assigned to the P3N3 gate during 1.8 V receive mode, the switching current demand from the derived voltages will be reduced at no cost of electrical overstress.

In addition, due to less contention of devices when transitioning from one operational mode to another, output driver circuit 200 switches fast.

These features make use of foundry-supported devices, i.e., the internal circuit process can be used to make the I/O devices, instead of high-cost high-voltage tolerant input/output (I/O) devices that would add additional mask and process cost, thus making it a low-cost innovative circuit solution.

The present disclosure uses only a single I/O external regulated supply i.e., 3.3 V and doesn't need any other regulators for 1.1 V and 2.2 V supplies as these are locally generated through an LDO. Due to the single I/O regulator, silicon validation takes less engineering effort to validate all power sequencing for automatic test equipment (ATE).

Design makes use of internally developed level-shifters to convert internal domain signals to 1.1 V domain signal, 1.1 V domain signal to 2.2 V domain signal and 2.2 V domain signal to 3.3 V domain signal which reduces the bill of material (BOM) cost of external components on a circuit board.

The present disclosure can also be easily ported to technologies beyond 5 nm node with different operation voltages as the circuit configuration is simple.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:

a first and second PMOS transistor serially coupled between a first high voltage power supply and a pad, a gate and drain of the second PMOS transistor connected to an adaptive control node and the pad, respectively; and a first and second NMOS transistor serially coupled between the pad and a ground, a gate and drain of the second NMOS transistor connected to the adaptive control node and the pad, respectively, wherein the adaptive control node is configured to switch between a first and second voltage, the first voltage being lower than the first high voltage power supply, and the second voltage being lower than the first voltage but higher than the ground, and wherein the adaptive control node is selectively coupled to a transmit logic circuit or a receive logic circuit in response to a state of an output enable signal.

2. The apparatus of claim 1, wherein a gate of the first PMOS transistor is coupled to a first signal from an internal circuit, the first signal configured to switch between the first voltage and the first high voltage power supply; and a gate of the first NMOS transistor is coupled to a second signal from the internal circuit, the second signal configured to switch between the second voltage and the ground.

3. The apparatus of claim 2, further comprising a third PMOS transistor serially coupled between the first and second PMOS transistor, and a third NMOS transistor serially coupled between the first and second NMOS transistor, wherein a gate of the third PMOS transistor is applied the first voltage and a gate of the third NMOS transistor is applied the second voltage.

4. The apparatus of claim 3, wherein the first, second and third PMOS transistors and the first, second and third NMOS transistors are manufactured in a same process as the internal circuit.

5. The apparatus of claim 2, wherein when the gate of the first PMOS transistor is at the first voltage and the gate of the first NMOS transistor is at the ground, the adaptive control node is at the second voltage.

6. The apparatus of claim 2, wherein when the gate of the first PMOS transistor is at the first high voltage power supply and the gate of the first NMOS transistor is at the second voltage, the adaptive control node is at the first voltage.

7. The apparatus of claim 1, wherein the transmit logic circuit receives a data signal switching between a logic high state and a logic low state, such that when the output enable signal enables the transmit logic circuit and the data signal is at the logic high state, the transmit logic circuit drives the adaptive control node to the first voltage and the pad is at the first high voltage power supply; and when the output enable signal enables the transmit logic circuit and the data signal is at the logic low state, the transmit logic circuit drives the adaptive control node to the second voltage and the pad is at the ground.

8. The apparatus of claim 7, wherein when the data signal is at the logic high state, the first signal is at the first voltage and the second signal is at the ground; and when the data signal is at the logic low state, the first signal is at the first high voltage power supply and the second signal is at the second voltage.

9. The apparatus of claim 1, wherein the receive logic circuit is coupled to the pad, such that when the output enable signal enables the receive logic circuit and the pad is at the first high voltage power supply, the receive logic circuit drives the adaptive control node to the first voltage; and when the output enable signal enables the receive logic circuit and the pad is at the ground, the receive logic circuit drives the adaptive control node to the second voltage.

10. The apparatus of claim 1, wherein when the output enable signal enables the receive logic circuit and the pad is at a second high voltage power supply lower than the first high voltage power supply, the receive logic circuit drives the adaptive control node to the second voltage.

11. The apparatus of claim 10, wherein the receive logic circuit receives a voltage select signal configured to switch between a logic high state and a logic low state depending on the pad being at the first high voltage power supply or the second high voltage power supply.

12. A system comprising:

a first, second and third PMOS transistor serially coupled between a first high voltage power supply and a pad, a gate of the first PMOS transistor coupled to a first signal from an internal circuit, the first signal configured to switch between a first voltage and the first high voltage power supply, the first voltage being lower than the first high voltage power supply, a gate of the second PMOS transistor being applied the first voltage, and a gate and drain of the third PMOS transistor connected to an adaptive control node and the pad, respectively; and a first, second and third NMOS transistor serially coupled between the pad and a ground, a gate of the first NMOS transistor coupled to a second signal from the internal circuit, the second signal configured to switch between a second voltage and the ground, the second voltage being higher than the ground but lower than the first voltage, a gate of the second NMOS transistor being applied the second voltage, and a gate and drain of the third NMOS transistor connected to the adaptive control node and the pad, respectively, wherein the adaptive control node is configured to switch between the first and second voltage, and wherein the adaptive control node is selectively coupled to a transmit logic circuit or a receive logic circuit in response to a state of an output enable signal.

13. The system of claim 12, wherein when the gate of the first PMOS transistor is at the first voltage and the gate of the first NMOS transistor is at the ground, the adaptive control node is at the second voltage.

14. The system of claim 12, wherein when the gate of the first PMOS transistor is at the first high voltage power supply and the gate of the first NMOS transistor is at the second voltage, the adaptive control node is at the first voltage.

15. The system of claim 12, wherein the transmit logic circuit receives a data signal switching between a logic high state and a logic low state, wherein when the output enable signal enables the transmit logic circuit and the data signal is at the logic high state, the transmit logic circuit drives the adaptive control node to the first voltage and the pad is at the first high voltage power supply, and wherein when the output enable signal enables the transmit logic circuit and the data signal is at the logic low state, the transmit logic circuit drives the adaptive control node to the second voltage and the pad is at the ground.

16. The system of claim 15, wherein when the data signal is at the logic high state, the first signal is at the first voltage and the second signal is at the ground; and when the data signal is at the logic low state, the first signal is at the first high voltage power supply and the second signal is at the second voltage.

17. The system of claim 15, wherein when the output enable signal enables the receive logic circuit and the pad is at a second high voltage power supply lower than the first high voltage power supply, the receive logic circuit drives the adaptive control node to the second voltage.

18. The system of claim 12, wherein the first, second and third PMOS transistors and the first, second and third NMOS transistors are manufactured in a same process as the internal circuit.

19. The system of claim 12, wherein the receive logic circuit is coupled to the pad, such that when the output enable signal enables the receive logic circuit and the pad is at the first high voltage power supply, the receive logic circuit drives the adaptive control node to the first voltage; and when the output enable signal enables the receive logic circuit and the pad is at the ground, the receive logic circuit drives the adaptive control node to the second voltage.

20. The system of claim 12, wherein the receive logic circuit receives a voltage select signal configured to switch between a logic high state and a logic low state depending on the pad being at the first high voltage power supply or the second high voltage power supply.

* * * * *